(12) United States Patent
Sekiyama (10) Patent No.: US 8,295,796 B2
(45) Date of Patent: Oct. 23, 2012

(54) HIGH FREQUENCY CIRCUIT

(75) Inventor: Yoshio Sekiyama, Osaka (JP)

(73) Assignee: Icom Incorporated, Osaka (JP)

( * ) Notice: Subject to any disclaimer, the term of this patent is extended or adjusted under 35 U.S.C. 154(b) by 191 days.

(21) Appl. No.: 12/888,956

(22) Filed: Sep. 23, 2010

(65) Prior Publication Data

US 2012/0001686 A1  Jan. 5, 2012

(30) Foreign Application Priority Data

Jun. 30, 2010 (JP) .................................. 2010-148573

(51) Int. Cl.
*H04B 1/04* (2006.01)
*H03F 3/189* (2006.01)

(52) U.S. Cl. ............... 455/127.1; 455/127.2; 455/127.3; 330/51

(58) Field of Classification Search ............... 455/127.1, 455/127.3, 127.2, 13.4, 17, 522, 343.1, 287, 455/293, 341, 194.2, 183.1; 330/51, 124 D, 330/124 R, 129, 277, 278, 295, 302, 286
See application file for complete search history.

(56) References Cited

U.S. PATENT DOCUMENTS

| 5,541,554 | A | * | 7/1996 | Stengel et al. | ................. | 330/51 |
| 5,548,246 | A | * | 8/1996 | Yamamoto et al. | ............. | 330/51 |
| 6,452,446 | B1 | * | 9/2002 | Eisenberg et al. | .............. | 330/52 |
| 6,621,253 | B2 | * | 9/2003 | Mendenhall | ................. | 323/210 |
| 6,646,505 | B2 | * | 11/2003 | Anderson et al. | ............. | 330/149 |
| 7,342,444 | B2 | * | 3/2008 | Kim et al. | .................. | 330/124 R |
| 7,408,405 | B2 | * | 8/2008 | Ohnishi et al. | .................. | 330/51 |
| 7,936,212 | B2 | * | 5/2011 | Pengelly | ................... | 330/124 R |
| 8,149,048 | B1 | * | 4/2012 | Mar | ............................ | 327/563 |
| 2010/0260076 | A1 | * | 10/2010 | Corman et al. | ............... | 370/277 |
| 2011/0103508 | A1 | * | 5/2011 | Mu et al. | ........................ | 375/295 |

FOREIGN PATENT DOCUMENTS

| JP | 05-211414 A | 8/1993 |
| JP | 10-190378 A | 7/1998 |
| JP | 10-322136 A | 12/1998 |
| JP | 2002-246919 A | 8/2002 |

* cited by examiner

*Primary Examiner* — Pablo Tran
(74) *Attorney, Agent, or Firm* — Posz Law Group, PLC (57) ABSTRACT

A high frequency circuit includes an amplifier part that includes a plurality of amplifier circuits amplifying a high frequency signal and connected in parallel, that synthesizes outputs of the amplifier circuit and that supplies the outputs to an antenna; a controller that outputs a low power signal during a low power mode in which the amplifier part operates at low power; and an operation suppressing circuit that disables one of the plurality of amplifier circuits based on the low power signal.

4 Claims, 6 Drawing Sheets

|  | Init | adjust |
|---|---|---|
| RF Power (High) | 122 | 0 |
| RF Power (Low) | 141 | -1 |
| RF Power (E-Low) | 92 | 3 |

Fig. 3B

|  | temp | | | inc. | | | |
|---|---|---|---|---|---|---|---|
|  | temp1 | temp2 | temp3 | inc1 | inc2 | inc3 | Inc4 |
| RF Power (High) | 84 | 117 | 185 | 14 | 3 | 0 | 14 |
| RF Power (Low) | 80 | 125 | 190 | -3 | -2 | 0 | -2 |
| RF Power (E-Low) | 73 | 145 | 200 | -7 | -4 | 0 | -7 |

Fig. 3C

|  | batt | | inc. | | |
|---|---|---|---|---|---|
|  | batt1 | batt2 | Vinc1 | Vinc2 | Vinc3 |
| RF Power (High) High Temp. | 114 | 124 | 0 | -55 | -10 |
| RF Power (High) Low Temp. | 100 | 120 | 0 | -30 | -10 |
| RF Power (Low) High Temp. | 114 | 124 | 0 | -8 | 0 |
| RF Power (Low) Low Temp. | 100 | 120 | 0 | -5 | 0 |
| RF Power (E-Low) High Temp. | 114 | 124 | 0 | -7 | 0 |
| RF Power (E-Low) Low Temp. | 100 | 120 | 0 | -5 | 0 |

Fig. 3D

|  | freq | | inc. | |
|---|---|---|---|---|
|  | freq1 | freq2 | Finc1 | Finc2 |
| RF Power (High) High Temp. | 153 | 158 | 0 | 0 |
| RF Power (High) High Temp. | 153 | 158 | 0 | 3 |
| RF Power (Low) High Temp. | 153 | 158 | 0 | 15 |
| RF Power (Low) Low Temp. | 153 | 158 | 0 | 7 |
| RF Power (E-Low) High Temp. | 153 | 158 | 0 | 20 |
| RF Power (E-Low) Low Temp. | 153 | 158 | 0 | 10 |

HIGH FREQUENCY CIRCUIT

CROSS REFERENCE TO RELATED APPLICATION

The present invention is related to, claims priority from, and incorporates by reference Japanese Patent Application No. 2010-148573, filed on Jun. 30, 2010.

TECHNICAL FIELD

This invention relates to a high frequency circuit for radio communications. In particular, this invention relates to a high frequency circuit for a portable transceiver.

BACKGROUND

Marine communications are performed as frequency modulation (FM) communications in the very high frequency (VHF) band. There is currently a demand to miniaturize portable transceivers for marine communications. For such a demand, an internal battery needs to be made small. For example, a single cell battery (3.7 V) is used.

The transceivers for marine communications also require relatively large antenna power (e.g., about 5 W). However, with the above-discussed small power source voltage, a single amplifier circuit using a single power transistor cannot produce the 5 W antenna power. To achieve a high output with low voltage, a structure that connects power amplifier circuits in parallel can be considered, as disclosed by Japanese Laid-Open Patent Application Publication No. H10-322136.

The transceivers for marine communications are required to operate in a high-output mode (or high power mode) with about 5 W but also in a low-output mode (or low power mode) with 1 W or 0.5 W. However, in the structure that connects multiple power amplifier circuits in parallel, as disclosed by JP Laid-Open Publication No. H10-322136, because fluctuations in circuit characteristics overlap for the number of power amplifier circuits, the fluctuations are amplified during the low-output mode, causing unstable operations.

Moreover, recently such transceivers are controlled by an internal central processing unit (CPU). Outputs of the power amplifier circuit are also controlled by approximately 8-bit power control signals output from the CPU. When controlling 0-5 W outputs by 8-bit signals (255 steps), the 1 W output is only ⅕ of the signals (51 steps), and 0.5 W output is only ½ of the ⅕ signals (i.e., about 26 steps). Therefore, during the control of low outputs, resolution degrades due to a reduced number of steps. Thus, the precision control is impossible.

This invention is developed considering such problems and allows to be obtained high power using a low-voltage battery. In addition, this invention provides a high frequency circuit that secures stability and fine control resolution during low-power operation.

SUMMARY

A high frequency circuit of the present invention includes an amplifier part that includes a plurality of amplifier circuits amplifying a high frequency signal and connected in parallel, that synthesizes outputs of the amplifier circuit and that supplies the outputs to an antenna; a controller that outputs a low power signal during a low power mode in which the amplifier part operates at low power; and an operation suppressing circuit that disables one of the plurality of amplifier circuits based on the low power signal.

In the preferred embodiment of the present invention, the amplifier circuits amplify the high frequency signal at a gain (amplification factor) that is set by a gain control voltage, and the controller generates a power control voltage that controls the outputs of the amplifier circuits. Further, the high frequency circuit includes a voltage dividing circuit that divides the power control voltage by a predetermined voltage ratio, a gain control voltage generation circuit that generates the gain control voltage by correlating with the divided power control voltage, and a voltage ratio changing circuit that is connected to the voltage dividing circuit and that decreases the voltage ratio of the voltage dividing circuit.

In the preferred embodiment of the present invention, the controller generates the power control voltage by outputting the power control signal that is digital data having a predetermined number of bits and by digital/analog converting the power control signal.

In the preferred embodiment of the present invention, the controller includes at least one of a voltage correction table and a frequency correction table, the voltage correction table configured to store correction data for correcting the power control signal based on a power source voltage, and the frequency correction table configured to store correction data for correcting the power control signal based on a signal transmission frequency, and the correction tables are further configured to store a plurality of pieces of the correction data according to temperature ranges.

This invention allows obtaining high power using a low-voltage battery. In addition, this invention provides a high frequency circuit that secures stability during low-power operation and fine control resolution.

DETAILED DESCRIPTION

A transceiver according to one embodiment of the present invention is described with reference to the drawings. The transceiver is, for example, a portable transceiver for marine communications that performs FM audio communications over the VHF band. Antenna power of approximately 5 W is required for the portable transceiver for marine communications. However, due to a demand for miniaturization, a large battery cannot be installed, and instead, a single cell (3.7V) battery is used.

Figure 1:
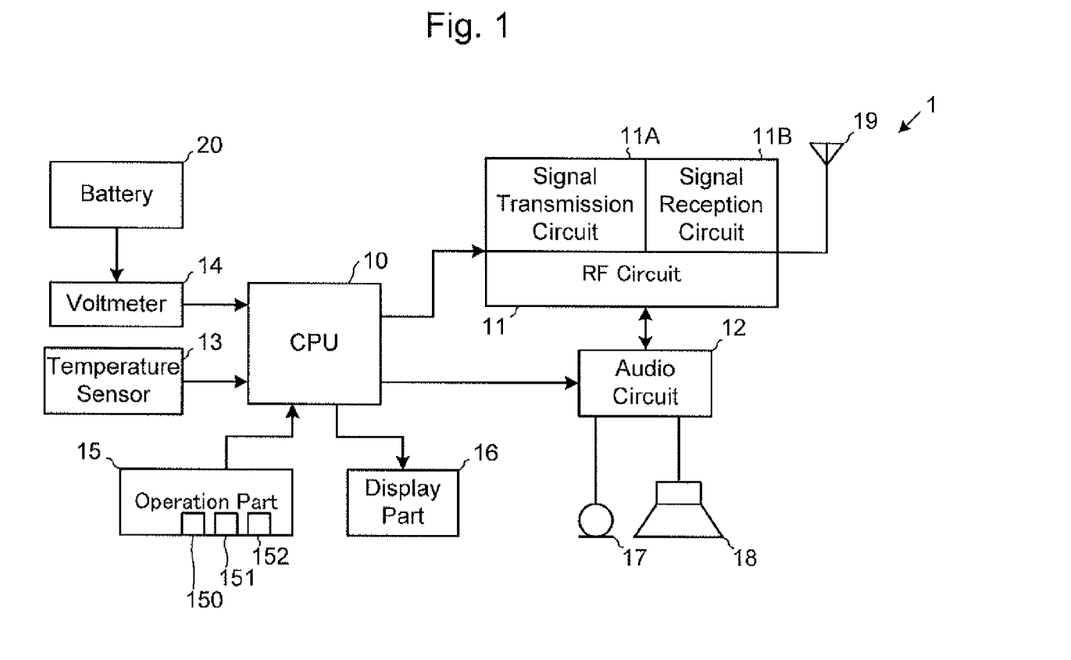
FIG. 1 is a block diagram of a transceiver according to one embodiment of this invention.

FIG. 1 is a block diagram of a transceiver 1. To a central processing unit (CPU) 10 that controls operations of the entire device, an RF circuit 11, an audio circuit 12, a temperature sensor 13, a voltmeter 14, an operation part 15 and a display part 16 are connected. The RF circuit 11 includes a signal transmission circuit 11A and a signal reception circuit 11B. The signal transmission circuit 11A processes signals to be transmitted to another device over the VHF band. The signal reception circuit 11B processes signals to be received from another device over the VHF band. To the RF circuit 11, an antenna 19 that radiates the transmission signals and receives signals from another device is connected. Details of the signal transmission circuit 11A of the RF circuit 11 are discussed later with reference to FIGS. 2 and 5.

A microphone 17 and a speaker 18 are connected to the audio circuit 12. The audio circuit 12 inputs speech sound signals input form the microphone 17 to the signal transmission circuit 11A of the RF circuit 11. In addition, the audio circuit 12 amplifies the speech sound signals input from the signal reception circuit 11B of the RF circuit 11 and outputs as sound from the speaker 11 (or earphone). The signal transmission circuit 11A controls a voltage control oscillator (VCO) 30 (see FIG. 2) by the speech sound signals input from the audio circuit 12 to oscillate FM-modulated carrier signals.

The below discusses mainly the signal transmission circuit 11A of the RF circuit 11. Therefore, the signal transmission circuit 11A of the RF circuit 11 may be simply called the RF circuit 11.

The temperature sensor 13 is a sensor that detects a temperature inside the housing of the transceiver (hereinafter called internal temperature). The signal transmission power of the RF circuit 11 that becomes the antenna power significantly fluctuates depending on the temperature. The fluctuation of the signal transmission power is compensated by controlling the RF circuit 11 based on the temperature detected by the temperature sensor 13. The voltmeter 14 is a sensor for detecting the voltage of a battery 20 (hereinafter called a power source voltage). The signal transmission power of the RF circuit 11 fluctuates depending on the supplied power source voltage. The CPU 10 compensates the fluctuation of the signal transmission power by controlling the RF circuit 11 based on the detected power source voltage.

The operation part 15 has a plurality of switches including a push-to-talk (PTT) switch 150 that switches transmission and reception of signals, a channel selection switch 151 that selects a communication channel (frequency), and a power selection switch 152 that switches signal transmission powers. By operating the power selection switch 152, the user is able to change the signal transmission power of the RF circuit 11 between three levels, for example: high power (5 W); low power (1 W) and eco low power (E-low power) (0.5 W). The display part 16 includes a liquid crystal display and displays a channel selected by the channel selection switch 151, a signal transmission power selected by the power selection switch 152, and the like.

The CPU 10 outputs, to the RF circuit 11, a power control signal (PCON), a low power signal (LOW), a mute signal (MUTE) and a channel selection signal (CH) in response to the operation of the operation part 15. The MUTE signal is a signal for stopping the signal transmission function of the RF circuit 11 and is output during a signal receiving mode.

Figure 2:
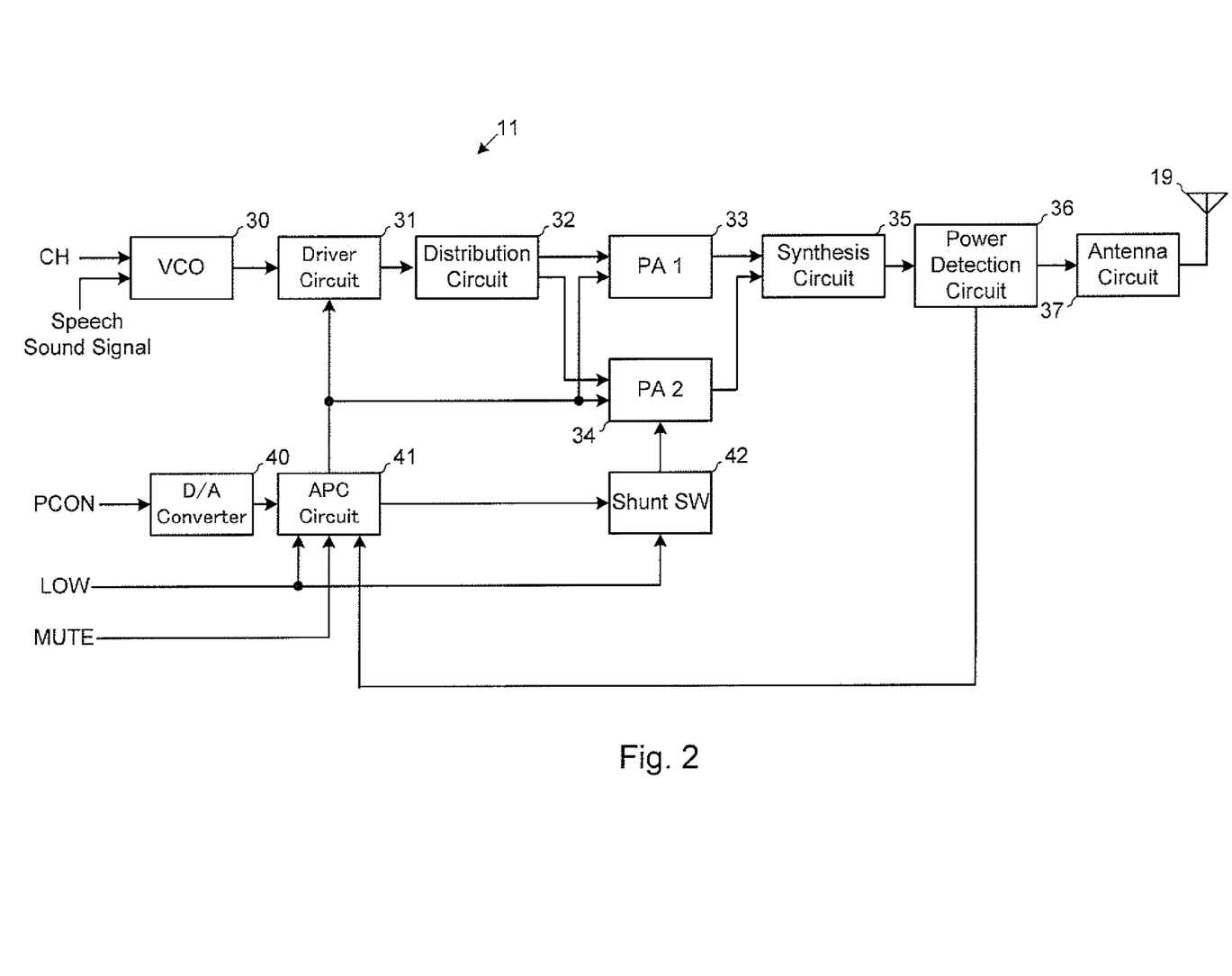
FIG. 2 is a block diagram of a radio frequency (RF) circuit of the transceiver.

FIG. 2 is a block diagram of the RF circuit 11. The power control signal is a signal for controlling the signal transmission power of the RF circuit 11 between 5 W, 1 W or 0.5 W and configured from 8-bit numerical value data. An automatic power control (APC) circuit 41 of the RF circuit 11 generates a gain control voltage based on the power control signal. Herein, the APC circuit 41 functions as a gain control voltage generation circuit. The gain control voltage is supplied to a driver circuit 31 and two power amplifiers (PA) 33 and 34.

The gain control voltage controls the signal transmission power by controlling the gain of these circuits.

The low power signal (LOW) is output from the CPU 10 to the RF circuit 11 when the selected power mode is the "low power" or the "E-low power." The low power signal is supplied to the automatic power control circuit 41 and a shunt switch 42 of the RF circuit 11.

The shunt switch 42 stops the operation of the power amplifier 34, which is one of the two power amplifiers 33 and 34, based on the input of the low power signal. Herein, the shunt switch 42 functions as an operation suppressing circuit.

Moreover, the automatic power control circuit 41 switches a range of control by the power control signal between 0-5 W to 0-1 W based on the low power signal. That is, the automatic power control signal 41 controls the signal transmission power in a range of 0-5 W during the high power mode based on the 8-bit (255 steps) power control signal, and controls the signal transmission power in a range of 0-1 W during the low power mode and the E-low power mode based on the 8-bit power control signal. As a result, the signal transmission power can be controlled using the entire 255 steps of the 8 bits in the range of 0-1 W during the low power mode and E-low power mode. Therefore, the resolution for the control is increased. The numerical values in the tables shown in FIGS. 3A-3D are the values in this control range.

FIGS. 3A-3D illustrate power control signal calculation tables included in the CPU 10. The CPU 10 has a storage means, such as a flash memory, and the power control signal calculation table is stored in the storage means.

FIGS. 3A-3D are a basic table, a temperature correction table, a power source voltage correction table, and a frequency correction table, respectively. Each table includes data rows for the three power modes (high power, low power and E-low power). This is because property variations differ depending on the signal transmission power.

Further, the data rows for each power mode in the power source voltage correction table and the frequency correction table include data rows for high and low temperatures in response to the internal temperature. The data row for high temperature is used when the internal temperature is equal to or greater than 0° C., and the data row for low temperature is used when the internal temperature is less than 0° C. Because the property variations for the power source voltage and the signal transmission frequencies differ depending on the internal temperature, two data rows are provided in response to such temperatures in this embodiment. The data rows for the temperatures are not limited to the high and low temperatures.

Figure 3A:
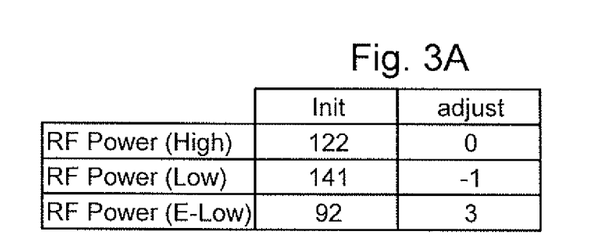
FIG. 3A is a table included in a CPU of the transceiver.

FIG. 3A is a basic table, in which standard values (Init) and adjustment values (Adjust) for the power control signals are stored. The standard values are the values for the power control signal calculated based on the standard functions of the RF circuit 11 of the transceiver 1. The adjustment values are values recorded during the post-manufacturing adjustment for correcting variations of each device. Addition of the standard values and the adjustment values becomes base values for the power control signal.

Figure 3B:
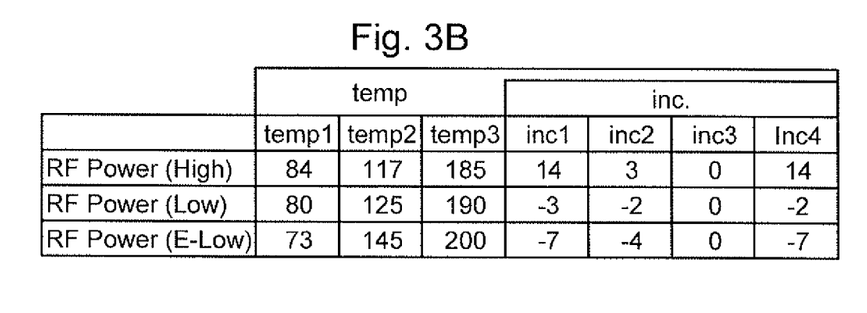
FIG. 3B is a table included in the CPU of the transceiver.
Figure 3C:
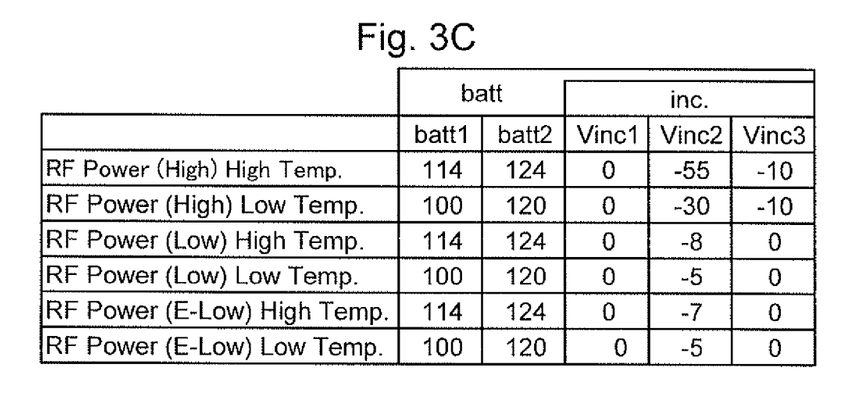
FIG. 3C is a table included in the CPU of the transceiver.
Figure 3D:
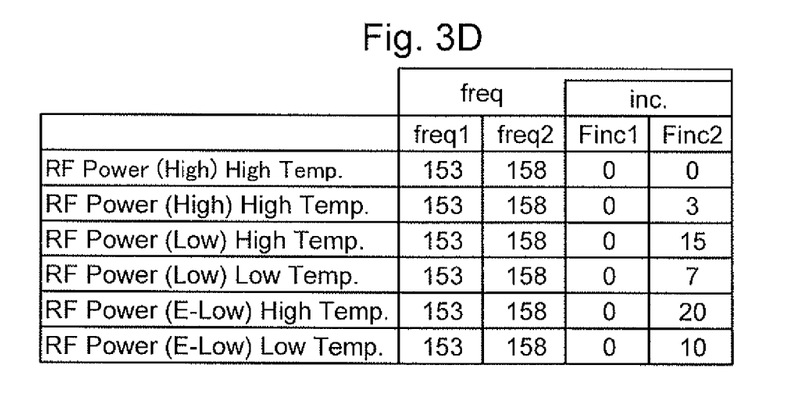
FIG. 3D is a table included in the CPU of the transceiver.

FIGS. 3B-3D are the temperature correction table, the power source voltage correction table and the frequency correction table, respectively. The property of the RF circuit 11 varies depending on the internal temperature, the power source voltage and the signal transmission frequency. These tables are used to calculate values for correcting the power control signal by compensating the property variations so that the signal transmission power is maintained constant. In the temperature correction table, data is stored for calculating the correction values for the power control signal in response to the internal temperature at the time. In the power source voltage correction table, data is stored for calculating the correction values for the power control signal in response to the internal temperature at the time. In the frequency correction table, data is stored for calculating the correction values for the power control signal in response to the signal transmission frequency at the time. Addition of the correction values calculated based on these tables and the base values becomes the final values for the power control signals.

In the temperature correction table, temperatures temp1-temp3, which are the plots in a line graph for calculating the temperature correction values, and inclinations of inc1-inc4 for the line graph, are written for each power modes. In the power source voltage correction table, temperatures batt1 and batt2, which are plots in a line graph for calculating the voltage correction value, and inclinations of Vinc1-Vinc3 for the line graph are written for each of the high and low temperatures for each power mode. In the frequency correction table, signal transmission frequencies freq1 and freq2, which are plots in a line graph for calculating the frequency correction value, and inclinations of Finc1 and Finc2 for the line graph are written for each of the high and low temperatures for each power mode.

Below describes a method for calculating a temperature correction value using the temperature correction table with an example of a value in the E-low power row in the temperature correction table shown in FIG. 3B.

Figure 4A:
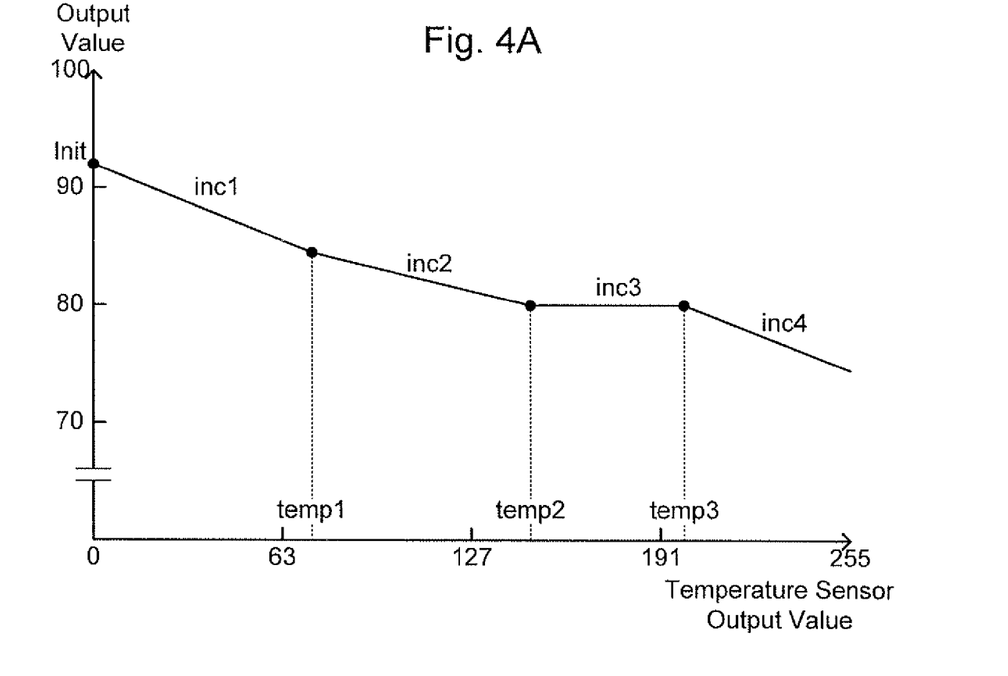
FIG. 4A illustrates a graph showing values in the table.

FIG. 4A show a graph including the horizontal axis for the output values of the temperature sensor 13 and the vertical axis for the temperature correction values based on the values in the E-low power rows in the temperature correction table (FIG. 3B).

The standard value (Init) in FIG. 3A is used as the initial value where the output value of the temperature sensor 13 is zero. From this point, the correction value changes along the inclination of inc1 until the output value of the temperature sensor 13 reaches the plot temp1 (73). From the plot temp1, the correction value changes along the inclination of inc2 until the output value of the temperature sensor 13 reaches the plot temp2 (145). From the plot temp 1, the correction value changes along the inclination of inc3 until the output value of the temperature sensor 13 reaches the plot temp3 (200). Because the inclination of inc3 is equal to zero, the correction value does not vary in the range from temp2 to temp3. In addition, in the region where the output value of the temperature sensor 13 is larger than the value at the plot temp3, the correction value changes along the inclination of inc4.

After receiving the internal temperature of the housing from the temperature sensor 13, the CPU 10 calculates a function of the line graph shown in FIG. 4A using the values in the temperature correction table of FIG. 3B and determines the correction value corresponding to the internal temperature.

Figure 4B:
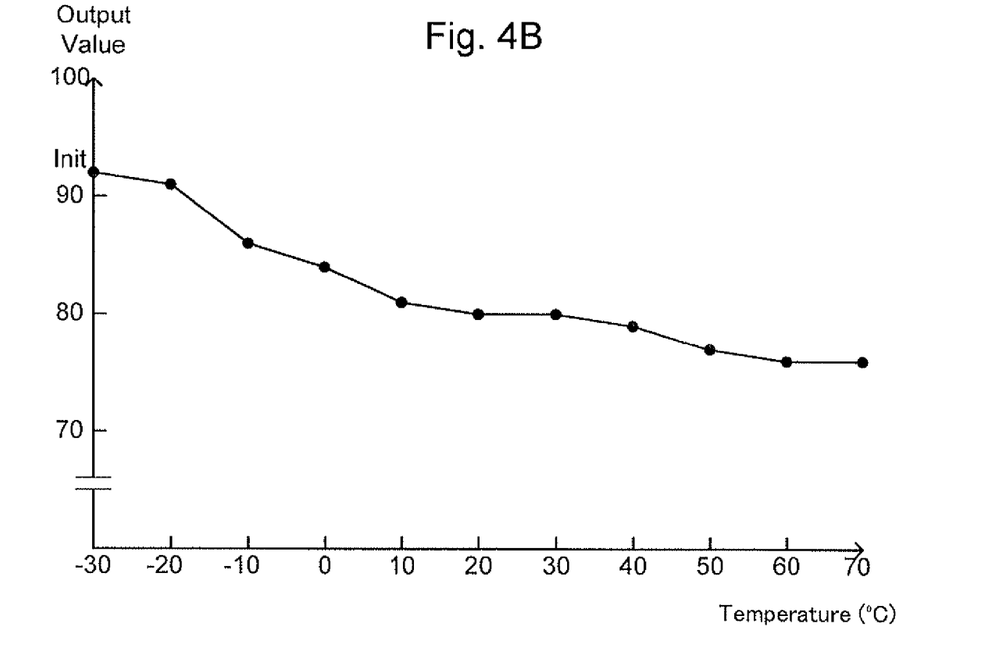
FIG. 4B illustrates a graph showing values in the table.

For a reference, FIG. 4B shows a line graph in which the horizontal axis of the line graph shown in FIG. 4A that determines the temperature correction value is replaced with the temperature (Celsius). The graph in FIG. 4A has detected values in the horizontal axis and is used for determining the correction value directly from the detected values. However, the detected values of the temperature sensor 13 do not change linearly with respect to the temperature. Thus, to ease the understanding of how the temperature correction values change with respect to the internal temperature of the housing, a graph including the horizontal axis that indicates units of the internal temperature is shown in FIG. 4B.

Figure 5:
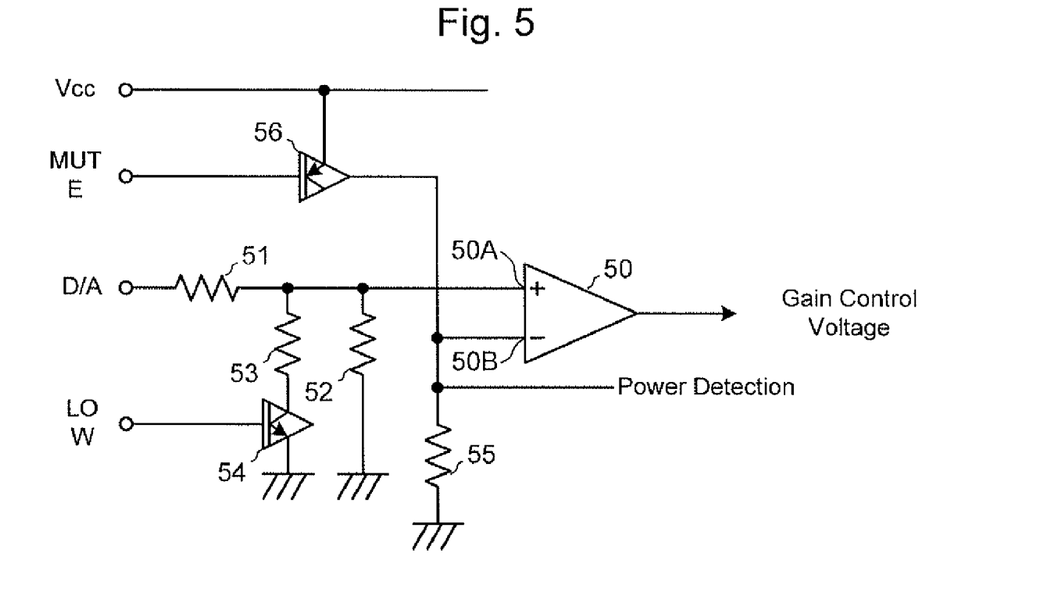
FIG. 5 is a schematic circuit diagram of an automatic power control circuit of the RF circuit.

The RF circuit is discussed further below with reference to FIGS. 2 and 5. FIG. 2 is a block diagram of the RF circuit 11, and FIG. 5 is a schematic circuit diagram of the automatic power control circuit 41 of the RF circuit 11. To achieve high signal transmission power (5 W) at low power source voltage (3.7V), the RF circuit 11 of the transceiver includes two power amplifiers (PA) 33 and 34 that are connected in parallel.

The RF circuit 11 further includes the following circuits: a voltage control oscillator (VCO) 30 that oscillates carrier signals over the VHF band, a driver 31 that amplifies the carrier signals output from the VCO 30 to a level at which the PAs 33 and 34 can be driven, a divider 32 that distributes the carrier signals amplified by the driver 31 and inputs to the two PAs 33 and 34, a combiner 35 that synthesizes the carrier signals output from the two PAs 33 and 34, a power detection circuit 36 that detects the power of the carrier signals synthesized by the combiner 35, an antenna circuit 37 that supplies the amplified carrier signals to the antenna 19, a digital/analog (D/A) converter 40 that converts the 8-bit power control signals input from the CPU 10 into voltages values, a automatic power control (APC) circuit 41 that generates a gain control voltage based on the power control signals, and a shunt switch (shunt SW) 42 that stops the operation of the second power amplifier 34 during the low power mode and the E-low power mode.

To the VCO 30, a channel selection signal that designates a signal transmission channel is input from the CPU 10, and a speech sound signal is input from the audio circuit 12. The VCO 30 oscillates the carrier signals, in which the frequency of the channel designated by the channel selection signal is FM-modulated for the speech sound signals.

The driver 31 amplifies the carrier signals input from the VCO 30. The amplification gain is controlled by the gain control voltage input from the APC circuit 41. Thereby, the level of the carrier signals input to the PAs 33 and 34 is controlled.

The divider 32 and the combiner 35 are both configured by a Wilkinson hybrid circuit, in which the time constant is set by an LC element. Because the transceiver for marine use uses a narrow band width, an LC element that can produce a narrower band width and can be made smaller than a stripline is used.

The PAs 33 and 34 are common source type power amplifier circuits that include a power MOS FET. The gain control voltage is input to the PAs 33 and 34 as well. The outputs of the PAs 33 and 34 are controlled by the gain control voltage so as to become the predetermined antenna power.

The shunt switch 42 is connected to the second PA 34. The shunt switch 42 is a circuit to shunt the gain control voltage for the PA 34 and to stop the operation of the PA 34. To the shunt switch 42, a low power signal output from the CPU 10 is input. Therefore, with the low power mode and the E-lower power mode, the operation of the second PA 34 stops, and the power amplifier circuit is operated by the PA 33 alone.

The power detection circuit 36 detects power that is synthesized by the combiner 35. The detected power (power detection voltage) is fed back to the automatic power control circuit 41.

The automatic power control circuit 41 generates the gain control voltage based on the power control signal converted into the voltage value that is input from the D/A converter 40, the low power signal (LOW) and the MUTE signal input from the CPU 10, and the power detection signal input from the power detection circuit 36. As discussed above, the gain control voltage is input to the driver 31 and the two PAs 33 and 34. The power control signal converted into the voltage value corresponds to the power control voltage of this invention.

The automatic power control circuit 41 is further discussed with reference to the schematic circuit diagram shown in FIG.

5. The automatic power control circuit 41 includes a differential amplifier circuit 50, as an active element that generates the gain control voltage. To the non-inverting input terminal 50A of the differential amplifier 50, the power control signal (PCON) that is converted into the voltage output from the D/A converter 40 is input via a voltage dividing resistance 51. Voltage dividing resistances 52 and 53 are connected between the non-inverting input terminal 50A and the ground. To the voltage dividing resistance 53, a semiconductor switch 54 is connected serially. When the semiconductor switch 54 is turned on, the voltage dividing resistance 53 operates between the non-inverting input terminal 50A and the ground and parallel with the voltage dividing resistance 53. The semiconductor switch 54 is turned on by the low power signal output from the CPU 10.

In other words, when the power mode is either in the low power mode or in the E-low power mode, the low power signal is output from the CPU 10 so that the resistance value between the non-inverting input terminal 50A and the ground decreases. Thereby, the voltage ratio of the power control signals is lowered. As a result, the voltage value to be input to the non-inverting input terminal 50A of the differential amplifier 50 is suppressed low even if a high voltage is output from the D/A converter 40. With this structure, the CPU 10 can utilize a large value for the power control signal even when output is designated at 1 W or less during the low power and E-low power mode, realizing a power control with high resolution.

Moreover, to the inverting input terminal 50B of the differential amplifier 50, the power detection voltage is fed back from the power detection circuit. As a result, the differential amplifier 50 controls the gain control voltage so as to stabilize the synthesis output of the PAs 33 and 34 based on the current output value. Further, the MUTE switch 56 is connected between the inverting input terminal 50B and the power source voltage Vcc. When the MUTE switch 56 is turned on, the inverting input terminal SOB is pulled up by Vcc, and does not output any power control voltage even where any voltage is input to the non-inverting input terminal 50A. That is, the driver 31 and the PAs 33 and 34 become a suspend mode, and the antenna power becomes zero (mute state).

The MUTE switch 56 is turned on by the MUTE signal that the CPU 10 outputs. The MUTE signal is continuously output while the transceiver is in the signal receiving state and stopped only when the signal transmission button is turned on.

Figure 6A:
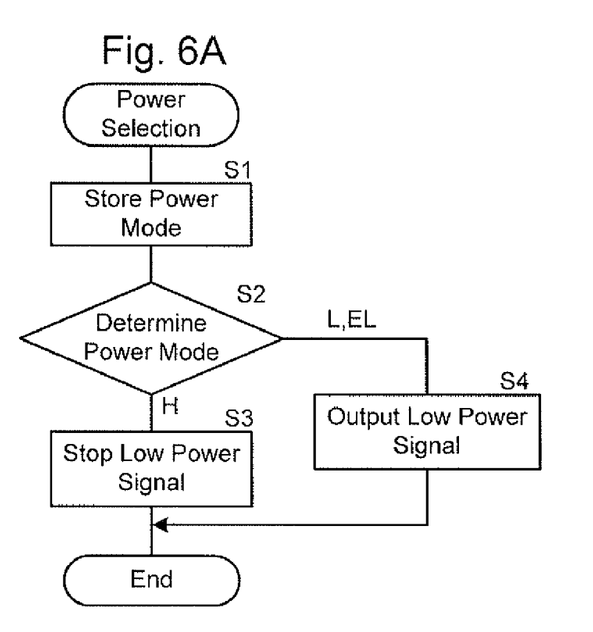
FIG. 6A is a flow diagram showing an operation of the CPU of the transceiver.
Figure 6B:
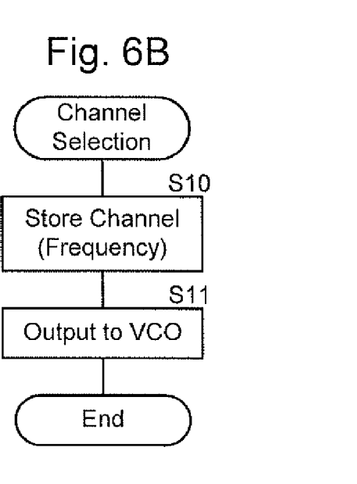
FIG. 6B is a flow diagram showing an operation of the CPU of the transceiver.
Figure 7:
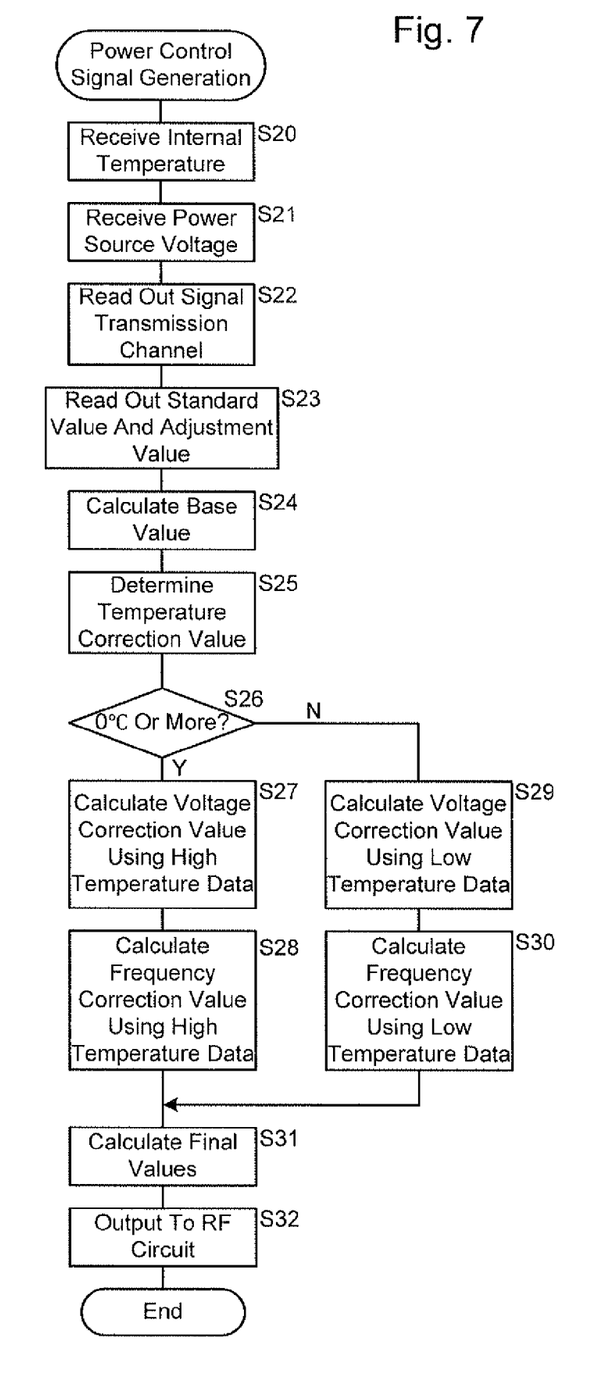
FIG. 7 is a flow diagram showing an operation of the CPU of the transceiver.

Referring to the flow diagrams in FIGS. 6 and 7, operation of the CPU 10 is described. FIG. 6A is a flow diagram showing an operation for switching the power modes. This operation is executed when the user operates the power selection switch 152 (power selection). The CPU 10 initially stores the selected power mode (S1) and determines that the selected power mode is the high power mode, the low power mode or the E-low power mode (S2). In the case of the high power mode, the CPU 10 stops the low power signal (S3). As a result, in the RF circuit 11, the second PA 34 turns on, and the second voltage diving resistance 53 of the APC circuit 41 is disconnected. In contrast, in the case of the low power mode or the E-low power mode, the low power signal is output to the RF circuit 11 (S4). As a result, in the RF circuit 11, the second PA 34 is shunted, and the second voltage dividing resistance 53 of the APC circuit 41 is connected. Accordingly, the voltage ratio of the power control signal is reduced, and the range of control by the power control signal can be narrowed, resulting increase in the resolution.

FIG. 6B is a flow diagram showing an operation to change the channels. The operation is executed when the channel selection switch 151 is operated by the user (channel selection). The CPU 10 initially stores the selected channel (S10). Then, a channel selection signal indicating the selected channel is output to the VCO 30 (S11). As such, the VCO 30 oscillates a carrier signal at a frequency for the selected channel.

FIG. 7 is a flow diagram for a process for generating the power control signal. The CPU 10 first collects information for correcting the power control signal. In other words, the CPU 10 receives an internal temperature from the temperature sensor 13 (S20), receives a power source voltage from the voltmeter 14 (S21), and reads out the currently selected signal transmission channel (S22). Next, the CPU 10 reads out a standard value and an adjustment value that correspond to the power mode from a basis table in FIG. 3A (S23) and calculates a base value by adding the standard value and the adjustment value (S24). Then, using the temperature correction table shown in FIG. 3B, a temperature correction value that corresponds to the internal temperature received at S20 is determined (S25). This process determines the correction value by applying the detected value of the internal temperature to the line graph (see FIG. 4A) drawn based on the values of the temperature correction table in FIG. 3B.

Next, a determination is made as to whether or not the detected internal temperature is equal to or greater than 0° C. (S26). When the detected internal temperature is 0° C. or greater (Yes at S26), a voltage correction value that corresponds to the power source voltage at that time is calculated using data in the data row for high temperature for the corresponding power mode in the power source voltage correction table in FIG. 3C (S27). Then, a frequency correction value that corresponds to the selected signal transmission channel at that time is calculated using data in the data row for high temperature for the corresponding power mode in the frequency correction table in FIG. 3D (S28).

On the other hand, when the detected internal temperature is less than 0° C. (No at S26), a voltage correction value that corresponds to the power source voltage at that time is calculated using data in the data row for low temperature for the corresponding power mode in the power source voltage correction table in FIG. 3C (S29). Then, a frequency correction value that corresponds to the selected signal transmission channel at that time is calculated using data in the data row for low temperature for the corresponding power mode in the frequency correction table in FIG. 3D (S30).

The correction values calculated by the above process are added to the base value so that the final values for the power control signal is calculated (S31). This power control signal is output to the D/A converter 40 of the RF circuit 11 (S32).

The final values of the power control signal are normalized such that the maximum value becomes 255. In addition, in this embodiment, the final values were determined by adding each correction values to the standard values of the power control signal. However, the final values may be determined by calculating a coefficient for each correction value and multiplying with the base value of the power control signal.

In this embodiment, the explanations were made with the portable transceiver 1 for marine communications as an example. However, this invention is not limited to the portable transceiver for marine communications. This invention may be widely used with a high frequency circuit, from which a high power source voltage cannot be obtained, or in which a high output mode and a low output mode can be switched.

A high frequency circuit is provided that allows obtaining high power using a low-voltage battery and that secures stability during low-power operation and fine control resolution.

What is claimed is:

1. A high frequency circuit, comprising:
an amplifier part that includes a plurality of amplifier circuits amplifying a high frequency signal and connected in parallel, that synthesizes outputs of the amplifier circuit and that supplies the outputs to an antenna;
a controller that outputs a low power signal during a low power mode in which the amplifier part operates at low power; and
an operation suppressing circuit that disables one of the plurality of amplifier circuits based on the low power signal, wherein
the amplifier circuits amplify the high frequency signal at a gain that is set by a gain control voltage, and
the controller generates a power control voltage that controls the outputs of the amplifier circuits,
the high frequency circuit further comprising:
a voltage dividing circuit that divides the power control voltage by a predetermined voltage ratio;
a gain control voltage generation circuit that generates the gain control voltage by correlating with the divided power control voltage; and
a voltage ratio changing circuit that is connected to the voltage dividing circuit and that decreases the voltage ratio of the voltage dividing circuit by the low power signal output from the controller.

2. The high frequency circuit according to claim 1, wherein the controller generates the power control voltage by outputting the power control signal that is digital data having a predetermined number of bits and by digital/analog converting the power control signal.

3. The high frequency circuit according to claim 2, wherein the controller includes at least one of a voltage correction table and a frequency correction table, the voltage correction table configured to store correction data for correcting the power control signal based on a power source voltage, and the frequency correction table configured to store correction data for correcting the power control signal based on a signal transmission frequency, and
the correction tables are further configured to store a plurality of pieces of the correction data according to temperature ranges.

4. The high frequency circuit according to claim 3, further comprising:
a temperature sensor that detects an internal temperature of the housing, wherein the temperature ranges are defined based on the internal temperature of the housing.

* * * * *